June 14, 1955 M. E. HINES 2,710,922

HIGH FREQUENCY OSCILLATOR

Filed Sept. 11, 1952 2 Sheets-Sheet 1

INVENTOR
M. E. HINES
BY
[signature]
ATTORNEY

June 14, 1955 M. E. HINES 2,710,922

HIGH FREQUENCY OSCILLATOR

Filed Sept. 11, 1952 2 Sheets-Sheet 2

INVENTOR
M. E. HINES
BY [signature]
ATTORNEY

United States Patent Office 2,710,922

Patented June 14, 1955

2,710,922

HIGH FREQUENCY OSCILLATOR

Marion E. Hines, Summit, N. J., assignor to Bell Telephone Laboratories, Incorporated, New York, N. Y., a corporation of New York Application September 11, 1952, Serial No. 309,044

11 Claims. (Cl. 250—36)

This invention relates to high frequency oscillators and more particularly to such oscillators capable of sweeping a wide frequency band.

Oscillators that can sweep a specific frequency band, and which are generally referred to as sweeping oscillators, find wide use in the testing of radio frequency and microwave components such as wave guides, filters, amplifiers, etc., and obviate the laborious task of making a large number of tests on each component at discrete and definite frequencies within the band of operation of that component. Such sweeping oscillators vary their output frequency continuously back and forth over a desired band.

Reflex klystrons readily lend themselves to use in sweeping oscillators as their output frequency may be tuned by varying the dimensions of an external cavity. It has been known to vary the cavity dimensions continuously by rapidly inserting and withdrawing plungers from the cavity. Further it has been known that to maintain optimum oscillation conditions throughout the entire sweep range, an alternating voltage should also be applied to the repeller electrode of the klystron, which voltage should be at its maximum negative value when the plungers tune the cavity to the highest frequency and at its maximum positive value when the plungers tune the cavity to the lowest frequency. Priorly the desired plunger motion has been obtained by cams or eccentric crank arrangements, but these prior devices tend to be complicated, expensive, and are likely to produce excessive vibrations and noises at speeds of operation even of the order of 60 cycles. Priorly also the alternating voltage applied to the repeller electrode has comprised an alternating voltage derived from an external source and superimposed on the direct current voltage of the repeller. Deriving this voltage variation from an external source through an appropriate network to adjust its phase and magnitude requires that considerable adjustments be made in the network each time the sweep range is varied. It is therefore both cumbersome and expensive.

It is a general object of this invention to provide an improved sweeping oscillator capable of operation at high frequencies over a wide band of frequencies.

It is a further object of this invention to simplify the tuning of a sweeping oscillator, minimize the vibrations and noise introduced by the continuous tuning of the oscillator, and reduce the size and expense of the tuning apparatus.

Further it is an object of this invention to minimize the power required to tune the sweeping oscillator over the broad band frequency range.

A still further object of this invention is to vary automatically the voltage applied to the repeller electrode of the klystron with variations in frequency of the sweeping oscillator. Thus, it is an object of this invention to simplify the application of a varying potential to the repeller electrode so that adjustment of the tuning range automatically adjusts the repeller voltage.

Further it is an object of this invention to prevent variations in frequency or line voltage applied to the oscillator from disturbing the synchronism of the frequency of the oscillator and the repeller voltage. Thus it is a still further object of this invention to obviate the necessity for separate compensating networks or adjustments to assure this synchronism.

These and other objects of this invention are attained in accordance with one specific illustrative embodiment wherein an external cavity reflex klystron tube is mounted in a rectangular wave guide cavity. The tuning over the desired frequency range of sweeping is attained by two oscillating plungers in the wave guide cavity, the plungers acting more or less as movable walls on two sides of the resonant chamber of the klystron. The plungers are advantageously of a non-contacting type and each is entirely supported by two leaf springs. By this double spring mount a high degree of rigidity is presented to all types of motion except laterally along the axis of the wave guide, i. e., into and out of the external resonant cavity. Advantageously the center portion of each of the plungers is of a magnetic material, such as iron, and coils encompass the end portion of each plunger. By alternately applying pulsating currents to the two coils at the ends of each plunger, the center magnetic portion of the plunger is alternately attracted by the coils to its left and right. Advantageously in accordance with one aspect of this invention, the frequency of natural oscillation of the plunger assembly, which is determined by the stiffness of the leaf springs and the mass of the plungers, is made equal to the frequency of the driving current pulsations applied to the two coils of each plunger so that the required driving force is a minimum.

As there are no sliding joints or contacts to produce frictional resistance to the motion of the plungers, the plungers and their spring mounts can thus be set into natural oscillation, more or less like a tuning fork. The natural elasticity of the springs acts to restore the plungers at all times to a neutral point, at which the center magnetic portion is between the two coils. As the plungers and their supports are light in weight and move in opposition to each other, the vibrational effects introduced by the plungers tend to cancel each other out.

It is known that for each frequency of oscillation of a klystron there is a particular repeller voltage at which the conditions for oscillation will be optimum. Deviation from this particular voltage will cause a decrease in available power output and may cause the klystron to cease oscillating. In this specific illustrative embodiment of this invention, an alternating voltage is applied to the repeller electrode, being thus superimposed on the direct current bias of the repeller electrode, and is derived from an electromechanical transducer attached to the plunger support springs. In this manner, the position of the springs themselves determines the magnitude of the voltage correction applied to the repeller electrode so that the output of the tube and the repeller voltage are always in phase at any instant during the sweeping of the oscillator. Various electromechanical transducers may be employed, the requirement being that the mechanical motion of the flat support springs be capable of translation by the transducer into a voltage or other electrical characteristic which is directly related to the position of the spring. Such transducers include piezoelectric crystal elements, a coil in a magnetic field, a variable resistance element such as a carbon pile resistor or a carbon microphone type of resistor. One particular type of electromechanical transducer that I have found readily employable in the combination of this invention is a strain gauge. Variable resistance strain gauges are known in the art, having been disclosed in E. E. Simmons, Jr., Patent 2,292,549, issued August 11, 1942, and comprise a filament of a very fine metallic wire of proper electrical strain characteristics woven into a suitable mat or embedded in a layer of adhesive insulating material spread upon a membrane such as a piece of thin paper. A piezoelectric strain gauge of the type employable in my invention is disclosed in W. H. Janssen Patent 2,558,563, issued June 26, 1951.

In this specific illustrative embodiment of this invention, a variable resistance strain gauge is advantageously secured, as by cement, to the inside of each of the inner support springs adjacent their base and is thus adjacent the point of maximum strain. As the springs bend there is a strain set up in the material of the gauge causing a stretching or a compression depending on the direction of the plunger movement. There is a similar stretching or compression in the strain gauge resistance wire which causes its resistance to vary in a corresponding manner. A substantially constant direct current is passed through the gauge and the variation in resistance of the gauge wire causes a corresponding change in the voltage drop across the gauge. This voltage is applied to the input of an amplifier, and the output of the amplifier is applied to the repeller electrode of the reflex oscillator.

It is therefore one feature of this invention that an oscillator be continuously tuned over a wide frequency band by a plunger supported on a flat leaf spring and vibrated in an external resonant cavity of the tube. Further it is a feature of this invention that the applied vibrating force be of a frequency substantially equal to the natural frequency of oscillation of the plunger and support spring.

It is another feature of this invention that the plunger comprise a center portion of magnetic material and that a coil encompass each end of the plunger, pulsating currents being applied alternately to the two coils to alternately attract the magnetic center portion of the plunger and thus cause vibration of the plunger in the resonant chamber of the tube.

It is a still further feature of this invention that an electromechanical transducer be supported by the support spring of the vibrating plunger and operated on motion of the spring, the varying output of the transducer being applied to the repeller electrode of the reflex oscillator tube to assure synchronism of repeller electrode bias and output frequency for optimum oscillation. More specifically in accordance with a feature of this invention, the electromechanical transducer in one specific embodiment comprises a strain gauge secured to the support spring adjacent the region of maximum strain, and a direct current is passed through the gauge, the variations in voltage drop across the gauge being applied to the repeller electrode of the reflex oscillator tube.

A complete understanding of this invention and of these and various other features thereof may be gained from consideration of the following detailed description and the accompanying drawing, in which.

Figure 1:
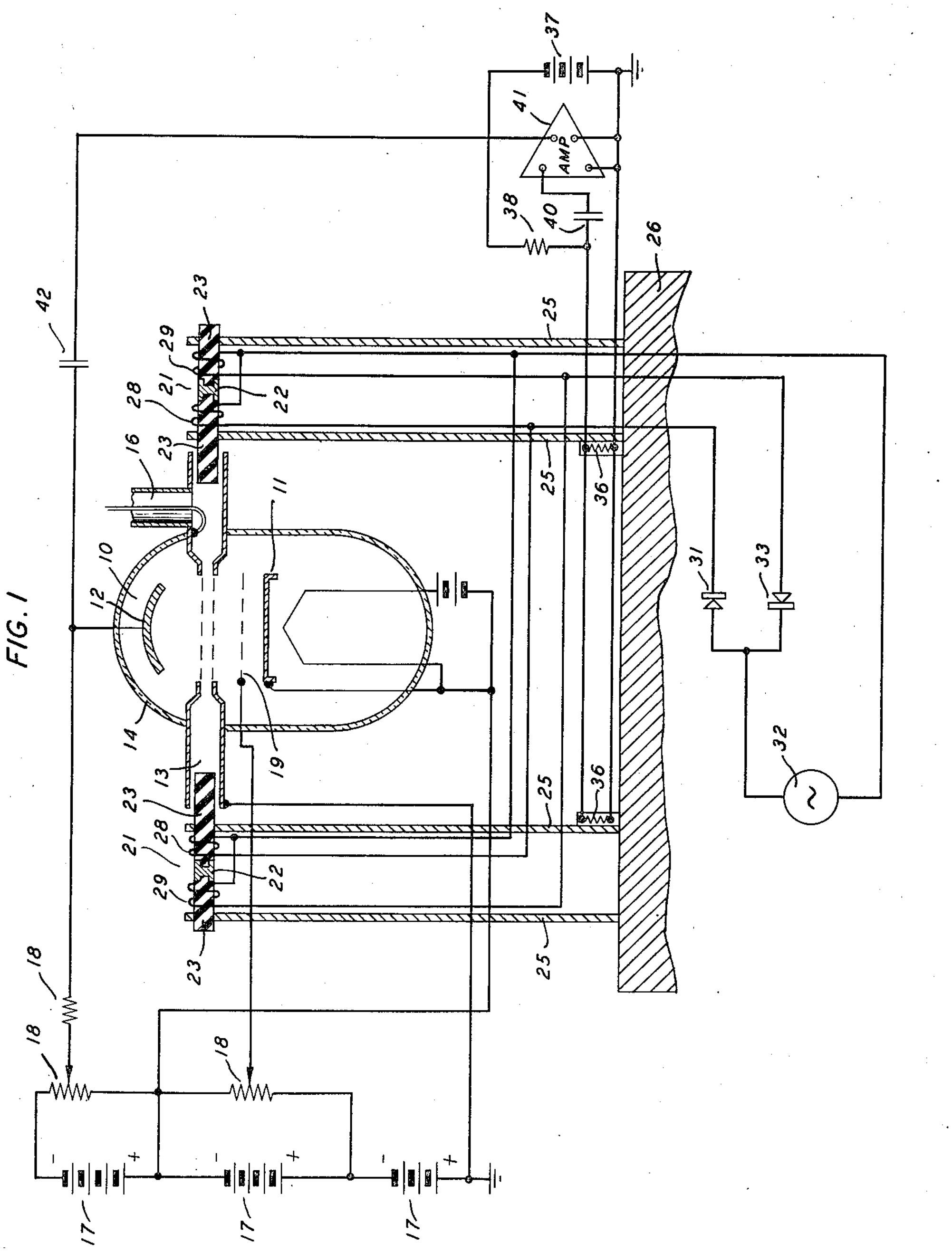
Fig. 1 is a schematic representation of one specific illustrative embodiment of this invention.

Turning now to the drawing, the specific illustrative embodiment of this invention depicted schematically in Fig. 1 comprises a vacuum tube 10 of the reflex klystron type having a cathode 11 and a repeller electrode 12. A resonant cavity 13 extends through the envelope 14 of the tube and an output circuit, represented in the drawing by the coaxial line 16, is connected to the cavity 13. A plurality of direct current voltage sources 17 together with resistors 18 provide appropriate biases for the cathode 11, the repeller electrode 12, and a grid 19.

Extending into the cavity 13 at opposite sides of the tube 10 are two plungers 21 which advantageously comprise a central magnetic portion 22, as of iron or cold rolled steel, and end insulating portions 23, as of phenol linen. The plungers 21 are each supported by two flat leaf springs 25, which may advantageously be of Phosphor bronze and which are secured to a base member 26. A pair of coils comprising an inner coil 28 and an outer coil 29 encompass each plunger 21 around the insulating portions 23 so that the magnetic central portion 22 is between the coils. The two inner coils 28 are joined together and through a rectifier 31 to an alternating current source 32 and the two outer coils 29 are joined together and are connected through a rectifier 33 poled oppositely to rectifier 31 to the source 32. The other side of each of the coils 28 and 29 is connected directly to the source 32. By means of the rectifiers 31 and 33, current is supplied alternately to the coils 28 and 29 so that the central magnetic portion 22 of the plungers 21 is alternately attracted by the inner and outer coils. In one specific embodiment the two innermost coils 28 pass current during each positive half cycle of the source 32 and the two outermost coils 29 during each negative half cycle. As each coil, during its active period, attracts the central magnetic portion 22 of the plungers, an alternating force is applied to the plungers depending on the frequency of the source 32. Advantageously in accordance with one aspect of this invention the frequency of the natural oscillations of the vibrating system comprising the plungers 21 and the spring 25 is adjusted to be substantially the same as the frequency of the source 32 and in one specific embodiment may expeditiously be 60 cycles. Thus the coils will set the plungers 21 into forced vibration at their natural resonant frequency, and a minimum of driving power is required to sustain the vibrations. The frequency of the vibrations of the tuning plungers 21 of course determines the rate at which the oscillator sweeps the desired frequency band. In one specific illustrative embodiment of this invention the plungers 21 tuned the cavity 13 continuously back and forth over a 1000 megacycle band at a 60-cycle rate, the frequency band being actually from 10,700 to 11,700 megacycles.

Attached to each of the inner leaf springs 25 is an electromechanical transducer. While various kinds of transducers may be employed, a variable resistance strain gauge 36 readily lends itself to employment in this invention because of its essential simplicity and ease of use. In one particular embodiment of this invention a standard strain gauge known as the SR-4 type C-10 manufactured by the Baldwin-Lima-Hamilton Corporation is employed, the gage consisting of a grid of fine resistance wire embedded in an insulating tape which is cemented or otherwise secured to the inner flat sides of the two inner springs 25. Advantageously two units 36 are employed, one for each plunger, and mounted on the plunger support springs 25 near the point of maximum strain next to the support block 26.

The two gauges 36 may be connected in parallel and to a direct current voltage source 37 through a high resistance 38 which assures that the current through the gauges will remain approximately constant regardless of the changes in their own resistances. The voltage drop across the strain gauges 36 is applied, through a direct current blocking condenser 40, to the input of an amplifier 41 and the output of the amplifier is applied, through another direct current blocking condenser 42, to the repeller electrode 12 of the tube 10. Thus by making the motion of the plunger itself determinative of the voltage correction to be applied to the repeller electrode 12 to assure an optimum repeller voltage for oscillation, the instantaneous repeller voltage and output frequency are always in proper phase relationship and no compensation for unavoidable transient conditions need be provided. Further when the frequency range over which the oscillator is swept is varied, no adjustment need be made in the repeller voltage connections as the increased or decreased swing of the support springs 25 will itself provide the proper adjustment of the repeller voltage correction.

Figure 2:
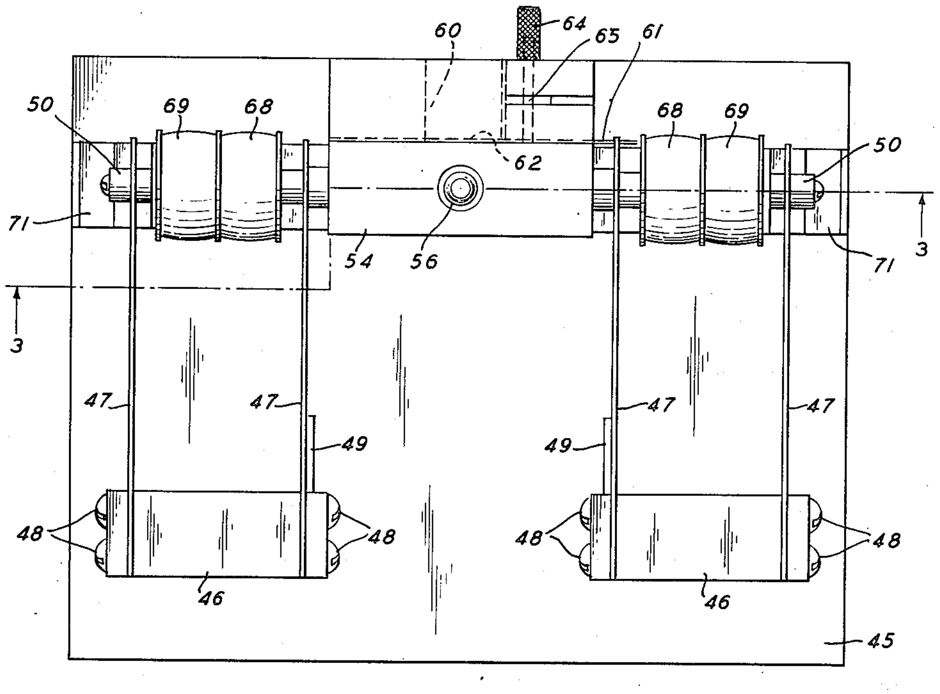
Fig. 2 is a plan view of one structural embodiment of the specific embodiment of Fig. 1.
Figure 3:
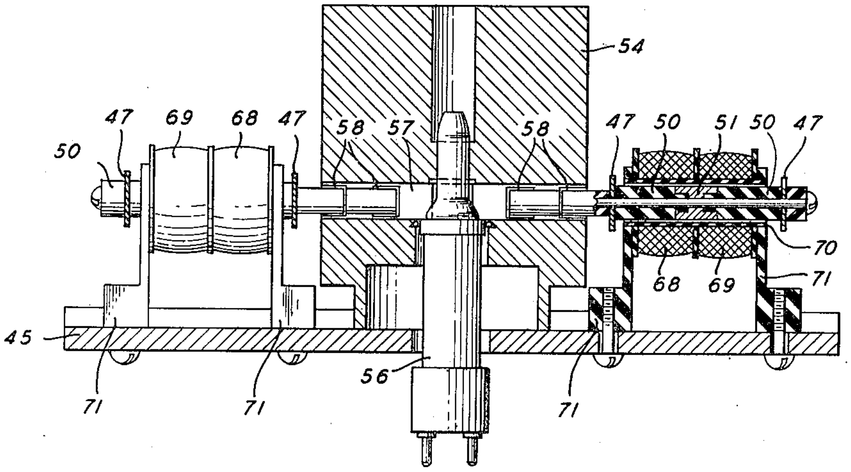
Fig. 3 is a sectional view of the embodiment of Fig. 2 taken along the line 3—3 thereof.

One specific structural embodiment of this invention in accordance with the embodiment of Fig. 1 is shown in Figs. 2 and 3 and comprises a base plate 45 on which are mounted at one side two support blocks 46 to which the flat springs 47 are secured as by countersunk screws 48. Strain gauges 49 are cemented to the inner surfaces of the two inside springs 47 adjacent the support blocks 46. The springs 47 extend along the base 45 and support at the other side of the base the plungers 50, each of which comprises a magnetic center portion 51, as best seen in Fig. 3. Positioned between the plungers 50 is a metallic housing 54 in which is positioned the reflex klystron 56. The housing 54 has an aperture 57 through it which defines the external cavity of the oscillator tube 56 and into which the plungers 50 extend. Advantageously the plungers 50 each support a piston 58 at their inner ends and a second piston 58 further along the plunger.

A rectangular aperture 60 extending from the back of the housing 54 communicates with the resonant chamber 57 and defines the output wave guide section to which external wave guide portions are attached, as by being screwed or bolted to the housing 54. The coupling between the output wave guide 60 and the resonant cavity or chamber 57 is determined by a shutter 61 which slides in an aperture 62 intercepting the communicating space between the wave guide 60 and the resonant cavity 57. The position of the shutter 61 is determined by a knob 64 and locking member 65.

The two coils 68 and 60 which encompass the plungers 50 are positioned on a hollow core 70 and mounted from the base 45 by brackets 71, which may advantageously be of phenol fibre.

It is to be understood that the above-described arrangements are illustrative of the application of the principles of the invention. Numerous other arrangements may be devised by those skilled in the art without departing from the spirit and scope of the invention.

What is claimed is:

1. A sweeping oscillator comprising a klystron tube cooperating with an external resonant cavity, said klystron tube including a repeller electrode, a plunger extending into said cavity, a leaf spring supporting said plunger for motion in and out of said cavity, means for vibrating said spring to cause said plunger to continuously tune said cavity, electromechanical transducer means attached to said spring, an electrical characteristic of said transducer means varying with the mechanical motion of said spring, and means applying a varying voltage proportional to the variations in said electrical characteristic to the repeller electrode of said klystron.

2. A sweeping oscillator comprising a klystron tube cooperating with an external resonant cavity, said klystron tube including a repeller electrode, a plunger extending into said cavity, a leaf spring supporting said plunger for motion in and out of said cavity, coil means encompassing said plunger, means applying pulsating current to said coil means to vibrate said spring whereby said plunger continuously tunes said cavity, electromechanical transducer means attached to said spring, an electrical characteristic of said transducer means varying with the mechanical motion of said spring, and means applying a varying voltage proportional to the variations in said electrical characteristic to the repeller electrode of said klystron.

3. A sweeping oscillator comprising a reflex klystron cooperating with an external resonant cavity, said klystron including a repeller electrode, a plunger extending into said cavity, a leaf spring supporting said plunger for motion in and out of said cavity, said plunger having a central magnetic portion, a first coil encompassing said plunger to one side of said central magnetic portion, a second coil encompassing said plunger to the other side of said central magnetic portion, means alternately supplying current to said coils to cause said coils to attract alternately said central portion, whereby said spring vibrates and said plunger continuously tunes said resonant cavity, an electromechanical transducer attached to said spring, an electrical characteristic of said transducer varying with the mechanical motion of said spring, and means applying a varying voltage proportional to the variations in said electrical characteristic to the repeller electrode of said klystron.

4. A sweeping oscillator in accordance with claim 3 wherein the natural frequency of oscillation of the vibrating system defined by said plunger and said spring is substantially equal to the frequency of alternations of said current between said two coils.

5. A sweeping oscillator in accordance with claim 3 wherein said electromechanical transducer is a strain gauge directly secured to said spring.

6. A frequency sweeping oscillator comprising a klystron tube cooperating with an external cavity, said klystron tube including a repeller electrode, a plunger extending into said cavity, a flat leaf spring supporting said plunger for motion in and out of said cavity, means for vibrating said spring to cause said plunger to continuously tune said cavity, a strain gauge secured to said spring, means passing a current through said strain gauge, and means applying a voltage proportional to the instantaneous voltage drop across said strain gauge to the repeller electrode of said klystron.

7. A sweeping oscillator comprising a klystron tube cooperating with an external resonant cavity, said klystron tube including a repeller electrode, a plunger extending into said cavity, a flat leaf spring supporting said plunger for motion in and out of said cavity, said plunger having a central magnetic portion, coil means encompassing said plunger, means applying current to said coil means to vibrate said spring whereby said plunger continuously tunes said cavity, a strain gauge attached to said spring, means passing a current through said strain gauge, and means applying a voltage proportional to the instantaneous voltage drop across said strain gauge to the repeller electrode of said klystron, said last-mentioned means including amplifier means.

8. A sweep oscillator in accordance with claim 7 wherein said coil means comprises a first coil encompassing said plunger to one side of said central magnetic portion and a second coil encompassing said plunger to the other side of said central magnetic portion and said current applying means comprises means alternately applying current to said coils to cause said coils to attract alternately said central portion.

9. A sweeping oscillator in accordance with claim 8 wherein the natural frequency of oscillation of the vibrating system defined by said plunger and said spring is substantially equal to the frequency of alternations of said current between said two coils.

10. A frequency sweeping oscillator comprising a reflex klystron tube cooperating with an external resonant cavity, said klystron tube including a repeller electrode, a pair of plungers extending into said cavity from opposite sides thereof, each of said plungers having a central magnetic portion, a pair of leaf springs supporting each of said plungers for motion in and out of said cavity, a first coil encompassing each of said plungers to one side of central magnetic portions, a second coil encompassing each of said plungers to the other side of said central magnetic portions, means alternately supplying current to said coils to cause said coils to attract alternately said central portions, whereby said springs vibrate and said plungers continuously tune said resonant cavity, a strain gauge secured to at least one of said springs supporting each of said plungers, means passing a direct current through said strain gauges, and means applying a voltage proportional to the instantaneous voltage drop across said strain gauges to the repeller electrode of said klystron.

11. A frequency sweeping oscillator comprising a vacuum tube cooperating with an external resonant cavity, displaceable plunger means extending into said cavity, said plunger means having a centrally positioned magnetic portion, leaf spring means supporting said plunger means for movement into and out of said cavity, a first coil encompassing said plunger means to one side of said magnetic portion, a second coil encompassing said plunger means to the other side of said magnetic portion, and means for alternately applying current to said coils to cause said coils to alternately attract said magnetic portion whereby the plunger continuously tunes said resonant cavity, the frequency of natural oscillation of the plunger assembly being substantially equal to the frequency of the driving current pulsations.

References Cited in the file of this patent

UNITED STATES PATENTS 2,436,640 Fredholm ------------ Feb. 24, 1948

OTHER REFERENCES

Microwave Sweep Generator, Electronics, vol. 23, Issue 11, pages 101–103, November 1950.